(12) United States Patent
Chen et al.

(10) Patent No.: US 7,823,045 B2
(45) Date of Patent: Oct. 26, 2010

(54) ERROR CORRECTION APPARATUS AND METHOD THEREOF

(75) Inventors: Chien-Chih Chen, Hsin-Chu Hsien (TW); Hui-Huang Chang, Hsin-Chu Hsien (TW); Shieh-Hsing Kuo, Taipei (TW); Hsin-Hung Lu, Taipei (TW)

(73) Assignee: Realtek Semiconductor Corp., Science Park, HsinChu (TW)

( * ) Notice: Subject to any disclaimer, the term of this patent is extended or adjusted under 35 U.S.C. 154(b) by 1050 days.

(21) Appl. No.: 11/463,900

(22) Filed: Aug. 11, 2006

(65) Prior Publication Data

US 2007/0067700 A1      Mar. 22, 2007

(30) Foreign Application Priority Data

Sep. 6, 2005     (TW) .............................. 94130611 A (51) Int. Cl.
   *G11C 29/00* (2006.01)
(52) U.S. Cl. ..................... 714/763; 714/758; 714/786
(58) Field of Classification Search ................. 714/763, 714/758, 784, 792, 786, 791, 799, 764, 768, 714/770; 386/46; 725/93
   See application file for complete search history.

(56) References Cited

U.S. PATENT DOCUMENTS

| | | | |
|---|---|---|---|
| 5,587,807 A * | 12/1996 | Ootsuka et al. ................ 386/46 |
| 6,317,855 B1 | 11/2001 | Horibe | |
| 6,662,335 B1 | 12/2003 | Huang | |
| 6,742,156 B2 | 5/2004 | Shieh | |
| 6,742,157 B2 | 5/2004 | Shieh et al. | |
| 6,810,500 B1 | 10/2004 | Chang | |
| 6,868,517 B1 | 3/2005 | Feng | |
| 7,127,736 B2 * | 10/2006 | Kondo et al. ................... 725/93 |
| 7,191,379 B2 * | 3/2007 | Adelmann et al. .......... 714/758 |
| 7,509,560 B2 * | 3/2009 | Alexander et al. .......... 714/763 |
| 2004/0243906 A1 | 12/2004 | Huang | |
| 2005/0193317 A1 | 9/2005 | Chen | |

FOREIGN PATENT DOCUMENTS

| TW | I227395 | 2/2005 |
|---|---|---|
| TW | I235911 | 7/2005 |

* cited by examiner

*Primary Examiner*—Fritz Alphonse
(74) *Attorney, Agent, or Firm*—Winston Hsu; Scott Margo; Min-Lee Teng (57) ABSTRACT

An error correction device includes a decoding unit, an error buffer, an error classifying unit and an error correction unit. The decoding unit reads data from a main memory and performs error detection on the data to generate error values and error addresses. Then, the error buffer temporarily stores the error values and the error addresses. The error classifying unit classifies the error addresses stored in the error buffer into a plurality of subclasses, where error values and error addresses which correspond to the same row of the main memory are classified into the same subclass. Finally, the error correction unit performs an error correction on the data stored in the main memory according to the plurality of subclasses. The error correction device therefore can reduce the amount of the change-row operations of the main memory so that the memory efficiency is increased.

10 Claims, 6 Drawing Sheets

ERROR CORRECTION APPARATUS AND METHOD THEREOF

BACKGROUND OF THE INVENTION

1. Field of the Invention

The invention relates to an error correction device and method thereof, and more particularly, to an error correction device and method capable of improving the efficiency of the system memory.

2. Description of the Prior Art

In general, when reading data from a DVD disc, the data in the DVD disc are first read by the pickup head of an optical disc drive. Then, the analog signal processor transforms the analog signals generated by the pickup head into digital signals, (e.g., eight-to-fourteen modulation signals). The eight-to-fourteen modulation signals are then processed by an EFM+ demodulator to form row data. Finally, these row data are stored in a memory.

Figure 1:
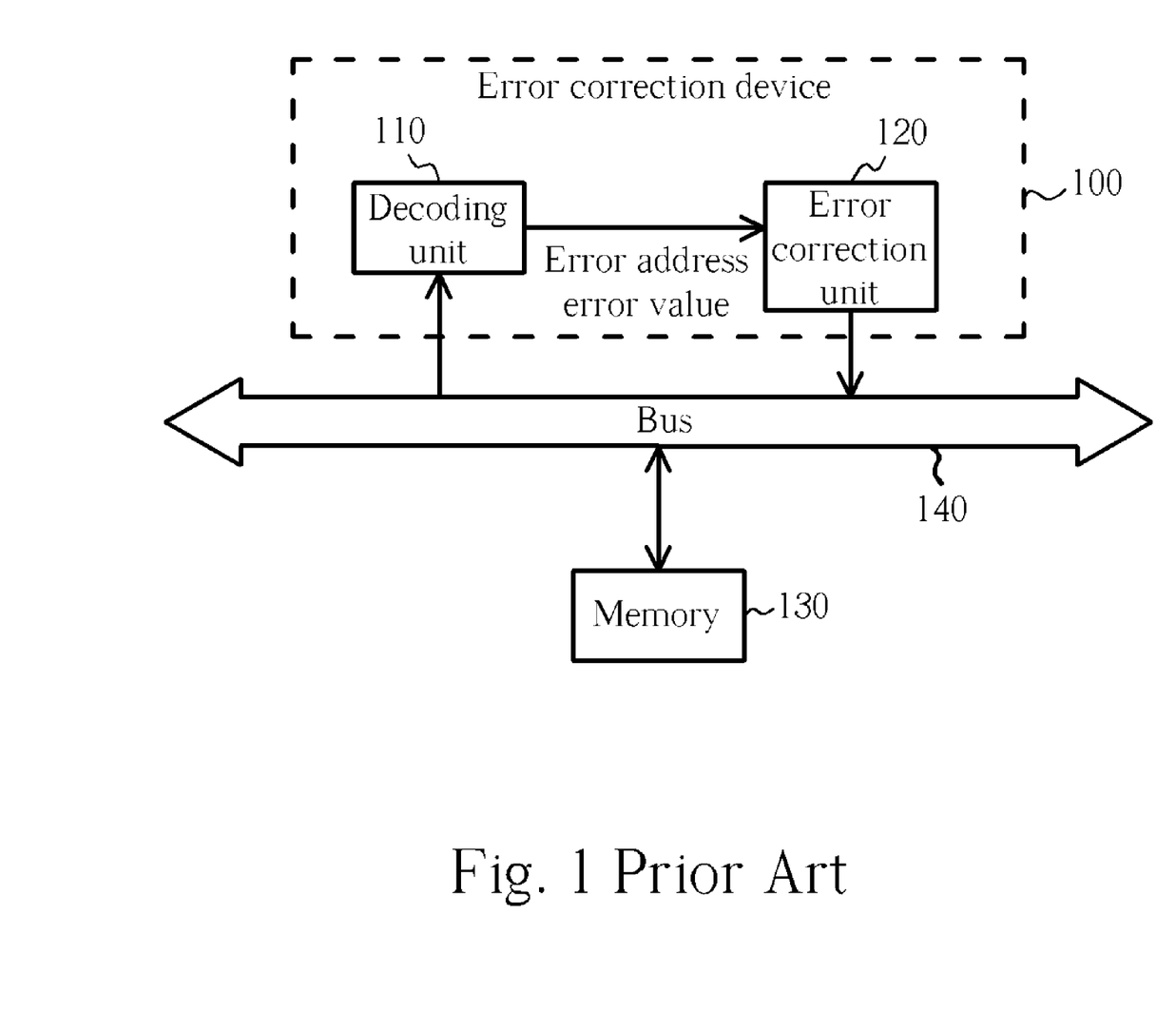
FIG. 1 is a block diagram of a conventional DVD error correction device.

Please refer to FIG. 1, which is a block diagram of a conventional DVD error correction device 100. As shown in FIG. 1, the error correction device 100 comprises a decoding unit 110 and an error correction unit 120. In this case, the error correction unit 120 is coupled to the decoding unit 110, and both the decoding unit 110 and the error correction unit 120 access data in the memory 130 through a bus 140. When the data, which are written into the memory 130, are sufficient to form an error correction code block (ECC block), the decoding unit 110 (e.g., a Reed Solomon Product-like Code (RSPC) decoder) reads the data from the memory 130 through the bus 140 and performs an inner-code parity (PI) decoding operation on the data. Then, the decoding unit 110 passes error addresses and error values to the error correction unit 120 according to the PI decoding results. The error correction unit 120 performs calculation according to the error values and the error addresses, such that the error correction unit 120 can correct some errors of the data stored in the memory 130 through the bus 140.

Subsequently, the decoding unit 110 again reads the data from the memory 130 through the bus 140 and performs an outer-code parity (PO) decoding operation on the data. Then, the decoding unit 110 passes error addresses and error values to the error correction unit 120 according to the PO decoding results. The error correction unit 120 performs calculation according to the error values and the error addresses, such that the error correction unit 120 can again correct some errors of the data stored in the memory 130 through the bus 140. After some repetitions, the data of the DVD, which are stored in the memory 130, can be completely corrected for following use.

Figure 2:
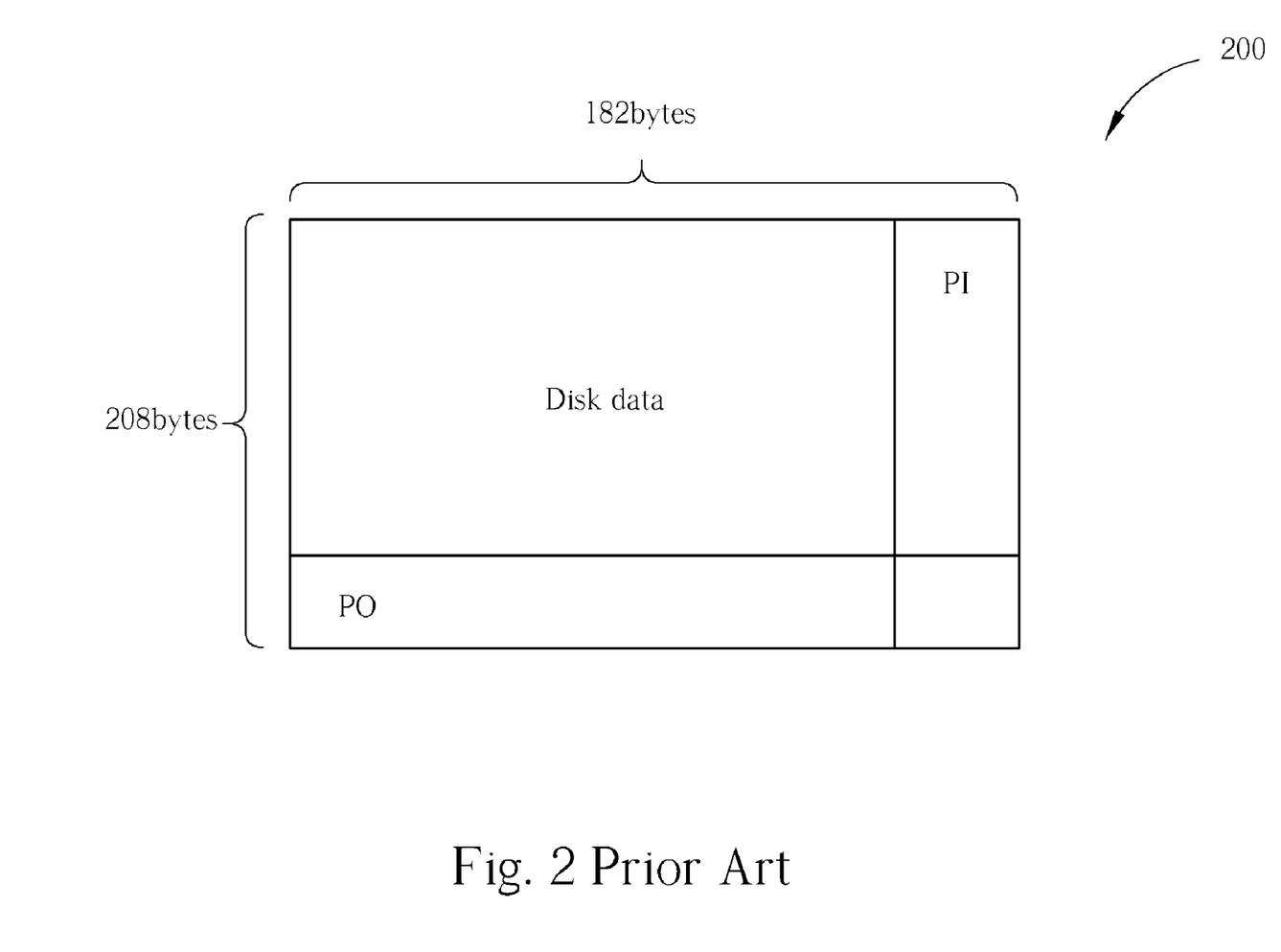
FIG. 2 is a diagram of a typical ECC block.

Please refer to FIG. 2, which is a diagram of a typical ECC block 200. As shown in FIG. 2, the ECC block 200 is a 182 byte×208 byte block, where in the PI direction (the horizontal direction) it has 182 bytes and in the PO direction (the vertical direction) it has 208 bytes. Please note that a row in the PI direction is called a PI codeword, and a column in the PO direction is called a PO codeword. In addition, the PI and PO regions represent different correction codes. As mentioned previously, the PI and PO are utilized by the decoding unit 110 to correct the errors of the DVD data.

Figure 3:
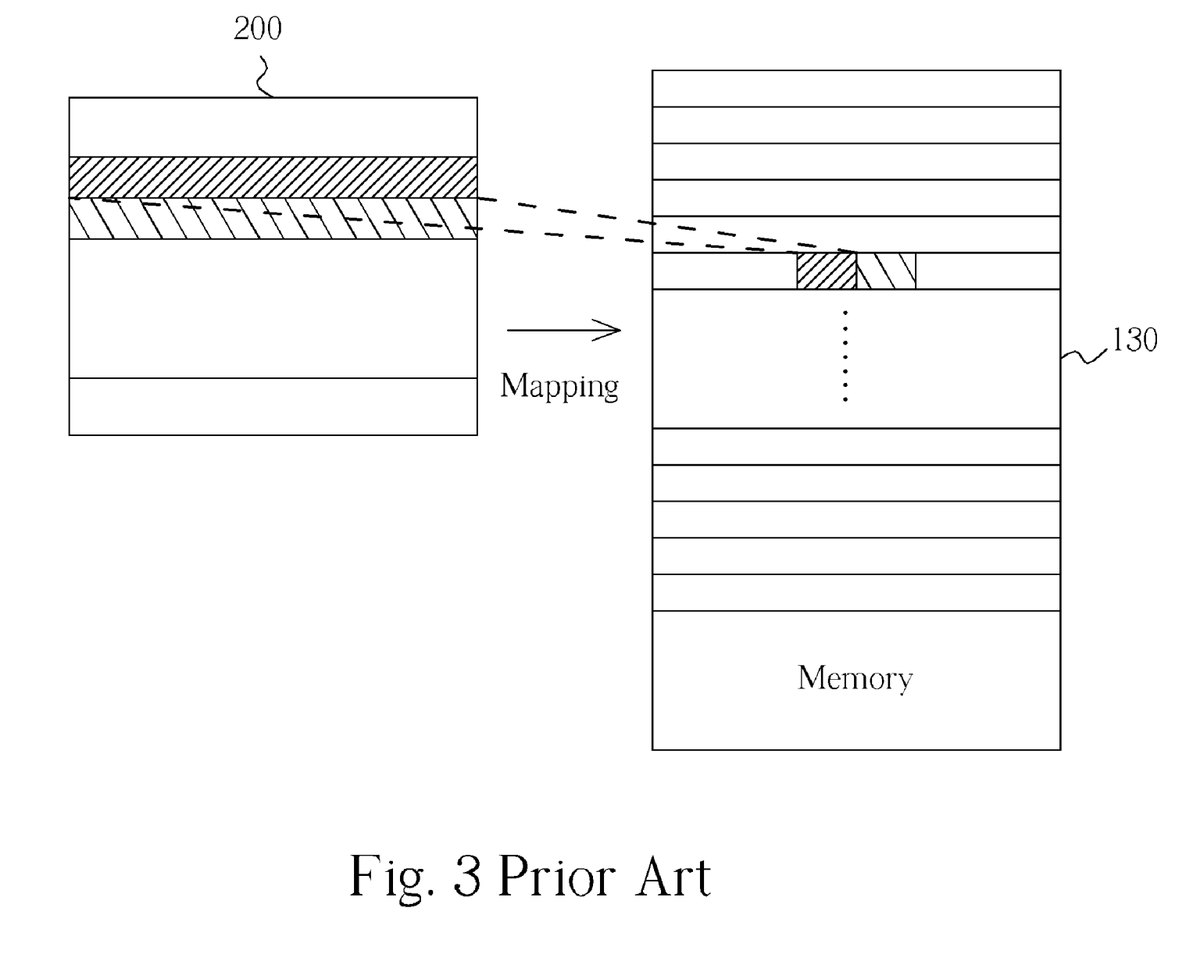
FIG. 3 is a diagram of mapping between the logical structure of the ECC block shown in FIG. 2 and the physical addressing of the memory shown in FIG. 1.

However, the memory 130 is often implemented by a dynamic random access memory (DRAM). It is well known that when the DRAM 130 accesses data, if a change row operation needs to be performed, additional memory clocks must be consumed to perform some additionally operations (e.g., row activating and row pre-charging operations). However, when the ECC block 200 is being stored into the memory 130, the data are written in the PI direction (e.g., as the above-mentioned row data). In order to illustrate more clearly, please refer to FIG. 3, which is a diagram of mapping between the logical structure of the ECC block 200 and the physical addressing of the memory 130. As shown in FIG. 3, the data of the ECC block 200 are row-by-row written into continuous positions of the memory 130. Because one PI codeword corresponds to 182 bytes, the PI codeword at most occupies two rows of the DRAM 130, due to its 1024-byte row width. Therefore, when the PI decoding operation is performed to execute the data correction operation, it is not necessary that the above-mentioned change row operation be performed for so many iterations. But, when the PO decoding operation is performed to execute the data correction operation, because data of a PO codeword is bound to distribute among multiple rows of the DRAM 130, the change row operation is performed many times. Obviously, frequent change row operations occupy many memory clock periods and result in poor efficiency of the memory 130.

SUMMARY OF THE INVENTION

It is therefore one of the objectives of the claimed invention to provide an error correction and method thereof capable of improving the utilization efficiency of the system memory.

According to an exemplary embodiment of the claimed invention, an error correction device is disclosed. The error correction device comprises: a decoding unit, coupled to a main memory, for reading a data from the main memory and performing an error detection on the data to generate a plurality of error values and a plurality of error addresses corresponding to the error values; an error buffer, coupled to the decoding unit, for temporarily storing the error values and the error addresses; an error classifying unit, coupled to the error buffer, for selecting a subclass according to the error address, wherein the subclass includes a plurality of specific error values and a plurality of specific error addresses corresponding to the specific error values; and an error correction unit, coupled to the error classifying unit and the main memory, for performing an error correction on the data stored in the main memory according to the specific error values and specific error addresses.

According to another exemplary embodiment of the claimed invention, an error correction method is disclosed. The error correction method comprises: reading a data from a main memory and performing an error detection on the data to generate a plurality of error values and error addresses corresponding to the plurality of error values; temporarily storing the plurality of error values and the plurality of error addresses; selecting a subclass from the plurality of error addresses, wherein the subclass comprises a plurality of specific error values and a plurality of specific error addresses corresponding to the plurality of specific error values; and performing an error correction on the data stored in the main memory according to the specific error values and specific error addresses.

These and other objectives of the present invention will no doubt become obvious to those of ordinary skill in the art after reading the following detailed description of the preferred embodiment that is illustrated in the various figures and drawings.

DETAILED DESCRIPTION

Figure 4:
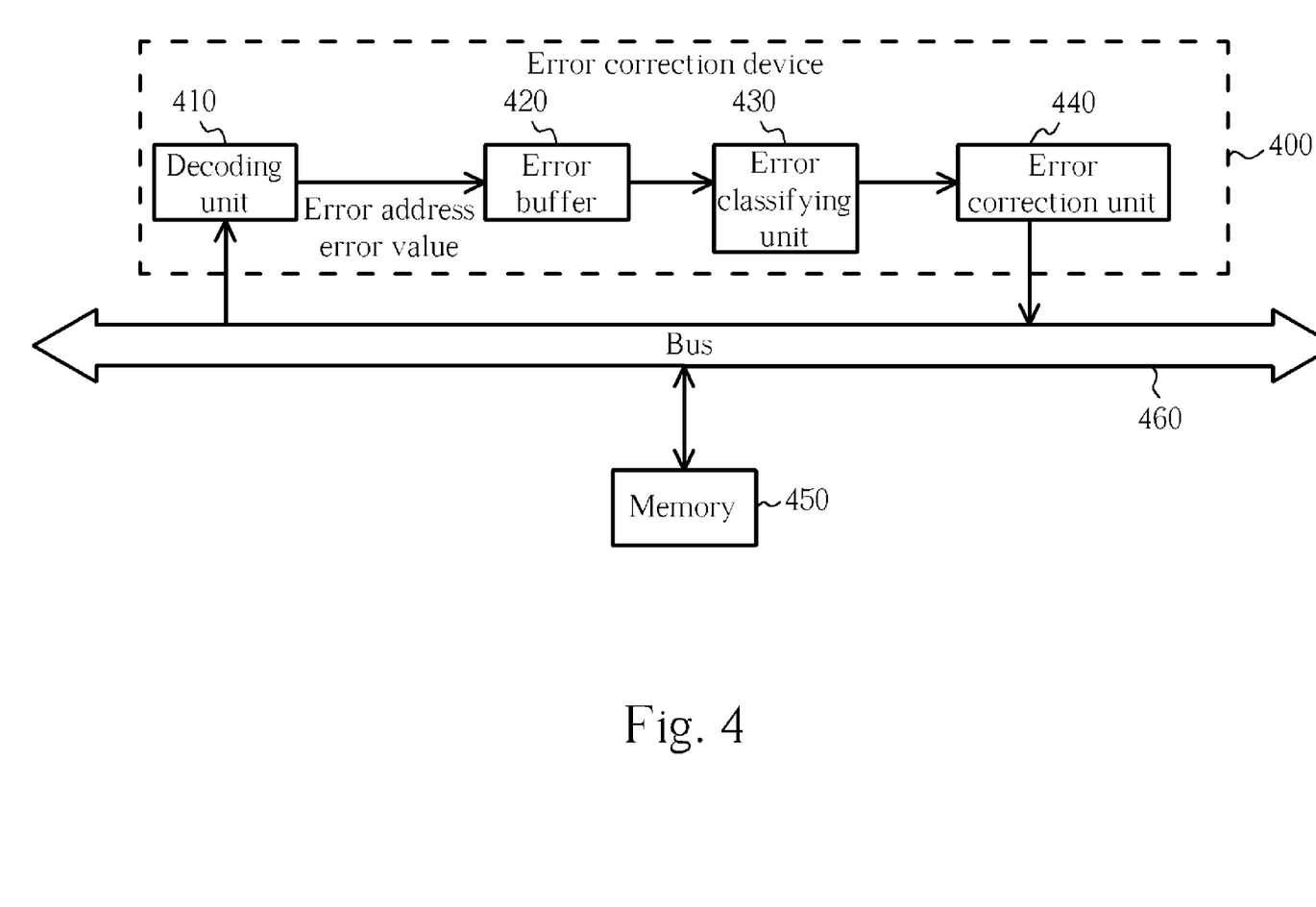
FIG. 4 is a block diagram of a DVD error correction device according to an embodiment of the present invention.

Please refer to FIG. 4, which is a block diagram of a DVD error correction device 400 according to an embodiment of the present invention. As shown in FIG. 4, the error correction device 400 comprises a decoding unit 410, an error buffer 420 coupled to the decoding unit 410, an error classifying unit 430 coupled to the error buffer 420, and an error correction unit 440 coupled to the error classifying unit 430. In addition, the decoding unit 410 and the error correction unit 440 are coupled to the memory 450 through the bus 460 in order to access data of the memory 450. The functions and the operations of the error correction device 400 are illustrated in the following disclosure.

Figure 5:
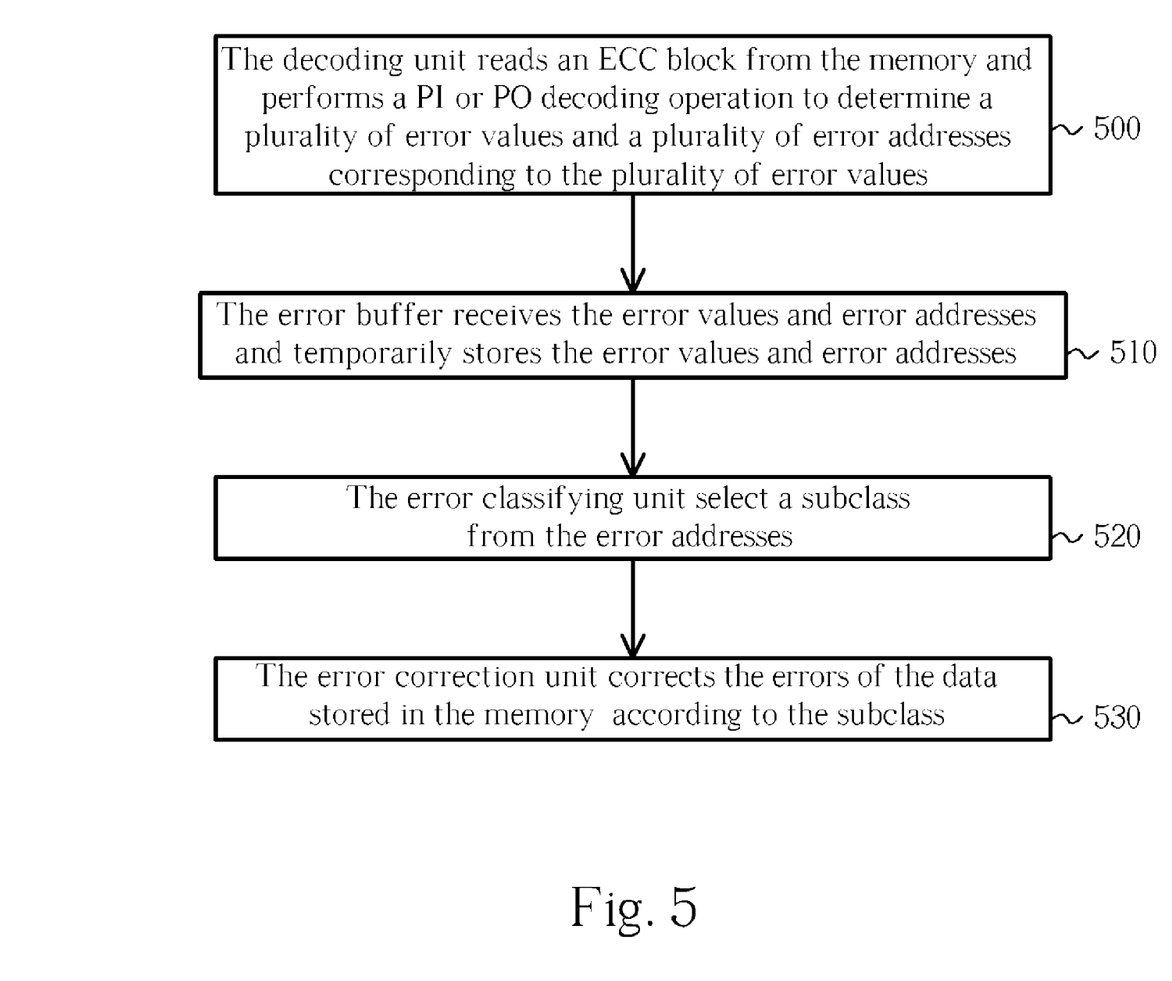
FIG. 5 is a flow chart illustrating the operation of the error correction device according to an embodiment of the present invention.

Please refer to FIG. 5, which is a flow chart illustrating the operation of the error correction device 400 according to an embodiment of the present invention. The flow comprises following steps:

Step 500: The decoding unit 410 reads an ECC block from the memory 450 and performs a Pl or PO decoding operation to determine a plurality of error values and a plurality of error addresses corresponding to the plurality of error values;

Step 510: The error buffer 420 receives the error values and error addresses and temporarily stores the error values and error addresses;

Step 520: The error classifying unit 430 selects a subclass from the error addresses; and Step 530: The error correction unit 440 corrects the errors of the data stored in the memory 450 according to the subclass.

In this embodiment, first, the decoding unit 410 reads an ECC block from the memory 450 through the bus 460 and performs the above-mentioned Pl or PO decoding operation on the ECC block. Because the disc data stored in the memory 450 may contain many errors, the decoding unit 410 can perform the Pl or PO decoding operation to determine the error values and corresponding error addresses according to the decoding results (step 500).

Then, the decoding unit 410 temporarily stores the error values and error addresses into the error buffer 420 (step 510). When the amount of the error values and the error addresses, which are written into the error buffer 420, reaches a threshold, the error classifying unit 430 performs a classifying operation according to the row addresses of the memory 450 that corresponds to the error addresses. For example, the error classifying unit 430 can gather the error addresses, which correspond to a same row of the memory 450, in a subclass. Therefore, multiple subclasses are determined. Then, these subclasses are outputted to the error correction unit 440 (step 520).

Lastly, the error correction unit 440 can correct errors of the DVD disc data stored in the memory 450 according to the error values and errors addresses in the subclasses (step 530). As is known, the error correction unit 440 utilizes error values and error data stored in the error addresses of the memory 450 to perform certain logical or arithmetic operation (for example, an XOR operation) on the error values and error data to recover correct data. Then, the correct data are written into the error addresses of the memory 450 through the bus 460 in order to overwrite the original error data stored in the memory 450, such that the goal of error correction can be achieved.

Because the error addresses of a specific subclass correspond to the same row of the memory 450, when the error correction unit 440 corrects the errors according to the error addresses of the specific subclass, there is no need to perform the aforementioned change-row operations, and time consuming actions such as repetitive activating and pre-charging operations of the memory can be avoided. Only when the error correction of one subclass is completely through, a change row operation of the memory 450 is required for the error correction unit 440 to perform error correction of another subclass. In other words, the potentially once every error correction of occurrence of change row operation in the conventional art can be dramatically reduced to once every subclass, because the error addresses corresponding to the same row are well classified into subclasses, as described in the above embodiment. This can save the operational time of the memory 450, and the efficiency of the memory 450 can be increased.

Please note, in order to optimize the utilization of the error correction device 400, the error correction device 400 can be designed such that when the decoding unit 410 decodes a predetermined amount of data, or the number of the error addresses stored in the error buffer 420 reaches a predetermined number, the error classifying unit 430 is activated to start classifying the error addresses stored inside the error buffer 420. Of course, the error correction device 400 can be also designed such that only when all error addresses are determined, the error classifying unit 430 is utilized to classify all the error addresses. Indeed, such operations can ensure that the change-row operation is minimized. However, this requires a huge storage space of the error buffer 420. In other words, under this setting, the error buffer 420 needs to have the capacity for storing all error addresses.

Figure 6:
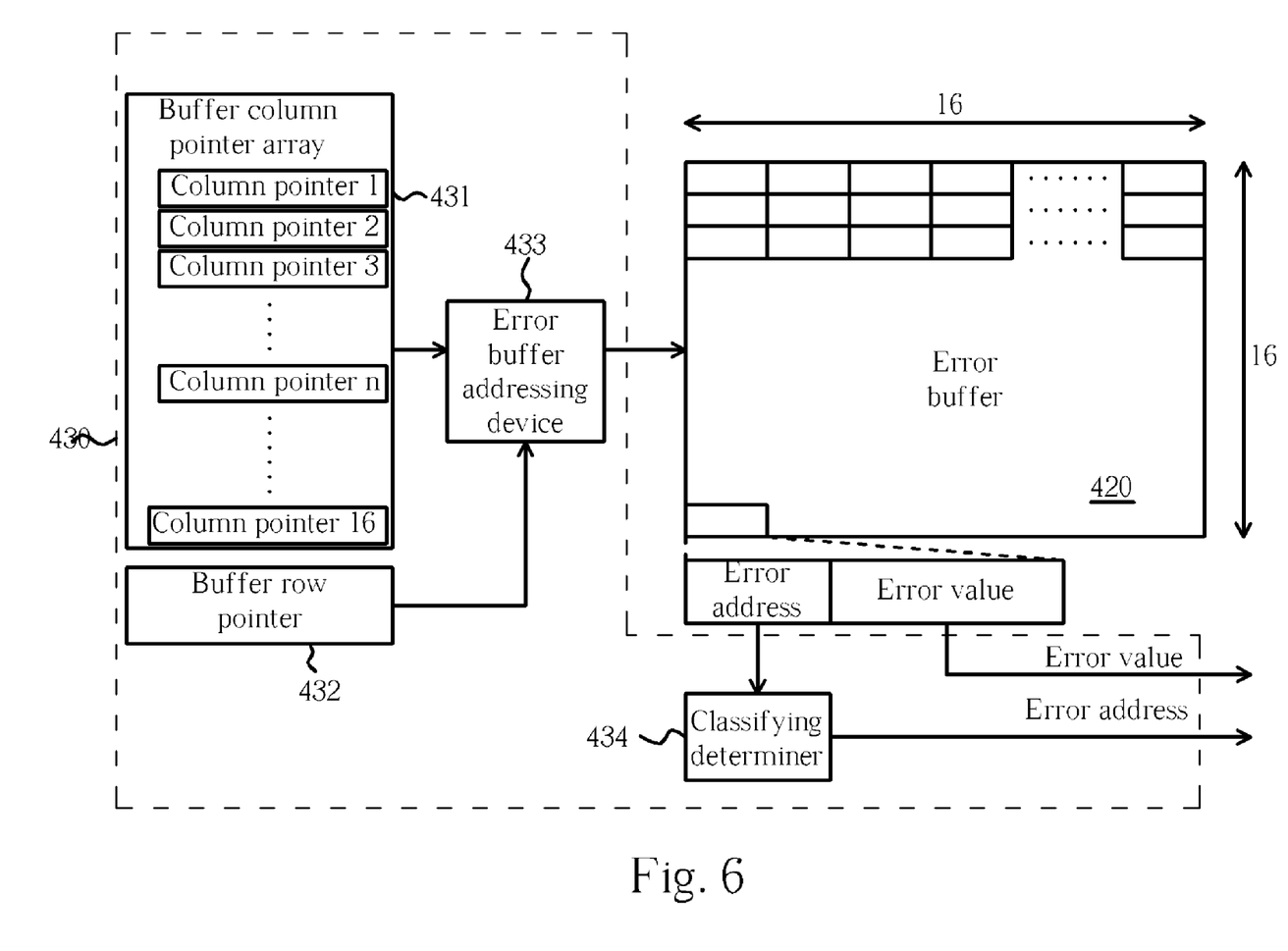
FIG. 6 is a diagram of the error classifying unit and the error buffer shown in FIG. 4.

For example, assume that the ECC block is stored into contiguous positions of the memory 450 row by row in the Pl direction. Please refer to FIG. 6, which is an embodiment diagram of the error classifying unit 430 and the error buffer 420 shown in FIG. 4. As shown in FIG. 6, the error classifying unit 430 comprises a buffer column pointer array 431, a buffer row pointer 432, an error buffer addressing device 433, and a classifying determiner 434. The error buffer addressing device 433 is coupled to the buffer column pointer array 431 and the buffer row pointer 432, and is utilized to perform the addressing operation on the error buffer 420, so that in subsequent operations, the error values and the error addresses stored in the error buffer 420 can be accessed smoothly.

Then, when the error correction operation is to be performed, the classifying determiner 430 reads the error values and error addresses stored in the error buffer 420 and classifies the error addresses according to their corresponding row of the memory 450. As mentioned previously, the classifying determiner 430 can continuously output error values and error addresses corresponding to the same row for the error correction unit 440 to perform the error correction operation on the data of the memory 450. Alternatively, the classifying determiner 430 can more coarsely classify the error addresses stored in the error buffer 420. For example, the classifying determiner 430 can classify the error addresses stored in the error buffer 420 according their addresses of the memory 450 as multiple subclasses, each collecting four rows of addresses of the memory 450. Then, when the error correction operation is being performed, the classifying determiner 430 outputs the subclasses such that the error correction unit 440 can correct the data of the memory 450. Because the addresses in a subclass still to certain degree correlate with one another, the change-row operations can be saved when the error correction operation is being performed.

In the following disclosure, an embodiment is used to illustrate the function and efficiency of the present invention. However, the amounts and the error correction method in the following disclosure only serve as an example, but not a limitation of the present invention.

Please note, in this embodiment, it is assume that the PO decoding operation can at most correct 16 errors at one time, and the error buffer can temporarily store 256 error values and error addresses. In other words, the error buffer 420 is sufficient to store 16 PO codewords and the row width of the memory 450 is 1024 bytes (i.e., one row of the memory 450 can store 1024 bytes).

First, because all errors contained in 16 PO codewords will not exceed 256 error values and error addresses, all errors can be stored inside the error buffer 420, which, in this embodiment, is a 16 byte×16 byte array. Furthermore, in this embodiment, the error classifying unit 430 is designed to gather every 16 rows of the ECC block as a subclass, therefore totaling 13 subclasses.

In other words, when the error correction operation is being performed, the error classifying unit 430 sequentially finds out the errors stored in the error buffer 420 corresponding to each subclass, preferably by identifying specific error addresses. Then, the error classifying unit 430 transfers the errors to the error correction unit 440. Therefore, the error correction unit 440 performs the error correction operation on the data of the memory 450 according to the outputted subclass. Notably, because the decoding unit 410 determines the errors in a column of the ECC block and stores them into the error buffer 420 in the order of these errors locating in said buffer, a full search of the error buffer 420 is not required when the error classifying unit 430 determines a subclass from the errors stored in the error buffer 420. For each row of the error buffer 420, which, in this embodiment, stores errors found in the same column of the ECC block, once the error classifying unit 430 identifies an error address outside the subclass currently under search, the search for this row of the error buffer 420 ends, leaving the rest of the error(s) in this row un-searched, and the search for the next row of the error buffer 420 starts. By doing so the search effort by the error classifying unit 430 can be further saved.

Because each subclass corresponds to 16 rows of the ECC block, which translates into 2912 bytes of data and occupies at most 4 memory rows, in this embodiment only four change-row operations, at most, are needed for error correction of each subclass. Consequently, at most 4*1 3=52 change-row operations are needed for error correction of the entire error buffer 420.

Averagely speaking, an ECC block roughly contains errors with the amount of 11.35 error buffers 420. Therefore, roughly 52*12=624 change-row operations are needed for correcting all errors. In contrast to the conventional art, where in the worst case 16*1 82=2912 change-row operations may be needed, the present invention obviously has higher memory efficiency.

Please note, the above-mentioned error correction method is not limited to uses beneficiary to the error correction in the PO direction. In practice, the error correction method can also used in the error correction in the Pl direction. Assuming that the Pl decoding operation can at most correct 10 errors at one time, and the error classifying unit 430 gathers 5 Pl codewords as a subclass before transferring the subclasses to the error correction unit 440, then because five Pl codewords translates into 910 bytes, which is less than the row width of the memory 450, a subclass at most occupies two memory rows. In other words, at most two change-row operations are needed for correcting errors of a subclass. Consequently, at most 2*42=84 change-row operations are needed for correcting errors of the entire ECC block. In contrast to the conventional art, where in the worst case 208*2=416 change-row operations may be needed, the present invention obviously has higher memory efficiency.

Therefore, one can alter the size of the storage spaces of the error buffer 420 and the timing of activating the error classifying unit 430 according to design choice, and still conforms to the spirit of the present invention. In addition, as is well known, the error correction device 400 mentioned in the above disclosure and the components thereof can be realized by ASICs, processors cooperating with firmware or software program codes, or a combination of the two, and still conforms to the spirit of the present invention.

Please note, in the above disclosure, the present invention error correction device and related method thereof are applied in the field of DVD data extraction. However, the present invention can be applied in any field of technology that implements memory error correction. In other words, the aforementioned DVD application serves only as a preferred embodiment, but not a limitation, of the present invention.

As is made clear by the above disclosure, the present invention can gather error addresses corresponding to the same memory row address, and sequentially handle the error addresses corresponding to the same memory row address. Therefore, the present invention can reduce the amount of the change-row operations of the DRAM. This saves the consumed memory clocks of change-row operations so that the memory efficiency is increased.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An error correction device comprising:
a decoding unit, coupled to a main memory, for reading a data from the main memory and performing an error detection on the data to generate a plurality of error values and a plurality of error addresses corresponding to the error values;
an error buffer, coupled to the decoding unit, for temporarily storing the error values and the error addresses;
an error classifying unit, coupled to the error buffer, for classifying the error addresses stored in the error buffer into a plurality of subclasses, wherein error values and error addresses which correspond to a same row of the main memory are classified into a same subclass; and
an error correction unit, coupled to the error classifying unit and the main memory, for performing an error correction on the data stored in the main memory according to the plurality of subclasses.

2. The error correction device of claim 1, wherein each of error values and error addresses of one subclass correspond to a same row of the main memory.

3. The error correction device of claim 2, wherein the main memory is a dynamic random access memory (DRAM).

4. The error correction device of claim 1, wherein the data is read from a disc.

5. The error correction device of claim 4, wherein the data is read from a digital versatile disc (DVD).

6. An error correction method comprising:

reading a data from a main memory and performing an error detection on the data to generate a plurality of error values and error addresses corresponding to the plurality of error values;

temporarily storing the plurality of error values and the plurality of error addresses;

utilizing an error classifying unit to classify the stored error addresses into a plurality of subclasses, wherein error values and error addresses which correspond to a same row of the main memory are classified into a same subclass; and performing an error correction on the data stored in the main memory according to the plurality of subclasses.

7. The error correction method of claim 6, wherein each of error values and error addresses of one subclass correspond to a same row of the main memory.

8. The error correction method of claim 7, wherein the main memory is a dynamic random access memory (DRAM).

9. The error correction method of claim 6, wherein the data is read from a disc.

10. The error correction method of claim 9, wherein the data is read from a digital versatile disc (DVD).

* * * * *